(12) United States Patent
Kuan et al.

(10) Patent No.: US 8,536,619 B2
(45) Date of Patent: Sep. 17, 2013

(54) STRAINED MOS DEVICE AND METHODS FOR FORMING THE SAME

(75) Inventors: Ta-Ming Kuan, Zhongli (TW); Chih-Hsin Ko, Fongshan (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 133 days.

(21) Appl. No.: 11/702,390

(22) Filed: Feb. 5, 2007

(65) Prior Publication Data

US 2008/0185617 A1 Aug. 7, 2008

(51) Int. Cl.
*H01L 29/66* (2006.01)
(52) U.S. Cl.
USPC ............ 257/192; 257/E21.431; 257/E21.619; 257/E21.634; 438/300
(58) Field of Classification Search
USPC .................. 438/300, 303; 257/192, 194, 77, 257/616, E21.403, E21.431, E21.619, E21.634
See application file for complete search history.

(56) References Cited

U.S. PATENT DOCUMENTS

| | | | | |
|---|---|---|---|---|
| 5,323,053 A | * | 6/1994 | Luryi et al. | 257/485 |
| 7,078,285 B1 | * | 7/2006 | Suenaga | 438/199 |
| 7,335,929 B2 | * | 2/2008 | Lin et al. | 257/192 |
| 7,378,308 B2 | * | 5/2008 | Hsu et al. | 438/231 |
| 7,504,301 B2 | * | 3/2009 | Waite et al. | 438/255 |
| 7,569,434 B2 | * | 8/2009 | Cheng et al. | 438/149 |
| 2002/0190284 A1 | | 12/2002 | Murthy et al. | |
| 2004/0262683 A1 | | 12/2004 | Bohr et al. | |
| 2006/0019455 A1 | | 1/2006 | Bu et al. | |
| 2006/0081875 A1 | * | 4/2006 | Lin et al. | 257/190 |
| 2008/0157208 A1 | * | 7/2008 | Fischer et al. | 257/368 |

FOREIGN PATENT DOCUMENTS

CN 1551356 A 12/2004

OTHER PUBLICATIONS

Ge, C.-H., of al., "Process-Strained Si (PSS) CMOS Technology Featuring 3D Strain Engineering," 2003, 4 pages, IEDM.
Thompson, S.E., et al., "A 90-nm Logic Technology Featuring Strained-Silicon," IEEE Transactions on Electron Devices, Nov. 2004, pp. 1790-1797, vol. 51, No. 11, IEEE.
Chinese Office Action, Application No. 200710110141.9, Mail date: Mar. 7, 2012, 7 pages.

* cited by examiner

*Primary Examiner* — David Vu
(74) *Attorney, Agent, or Firm* — Slater & Matsil, L.L.P.

(57) ABSTRACT

A semiconductor structure includes a semiconductor substrate having a top surface; a gate stack on the semiconductor substrate; and a stressor in the semiconductor substrate and adjacent the gate stack. The stressor comprises at least a first portion with a first top surface lower than the top surface of the semiconductor substrate.

18 Claims, 8 Drawing Sheets

STRAINED MOS DEVICE AND METHODS FOR FORMING THE SAME

TECHNICAL FIELD

This invention relates generally to semiconductor devices, and more particularly to structures and formation methods of MOS devices with stressors.

BACKGROUND

Reductions in the size and inherent features of semiconductor devices, for example, metal-oxide semiconductor (MOS) devices, have enabled continued improvements in speed, performance, density, and cost per unit function of integrated circuits over the past few decades. In accordance with a design of the MOS device and one of the inherent characteristics thereof, modulating the length of a channel region underlying a gate between a source and a drain of a MOS device alters a resistance associated with the channel region, thereby affecting the performance of the MOS device. More specifically, shortening the length of the channel region reduces a source-to-drain resistance of the MOS device, which, assuming other parameters are maintained relatively constant, may allow for an increase in current flow between the source and drain when a sufficient voltage is applied to the gate of the MOS device.

To further enhance the performance of MOS devices, stresses may be introduced in the channel region of a MOS device to improve its carrier mobility. Generally, it is desirable to induce a tensile stress in the channel region of an n-type MOS (NMOS) device in a source-to-drain direction and to induce a compressive stress in the channel region of a p-type MOS (PMOS) device in a source-to-drain direction.

A commonly used method for applying compressive stresses to the channel regions of PMOS devices is to grow silicon germanium (SiGe) stressors in source and drain regions. Such a method typically includes the steps of forming a gate stack on a semiconductor substrate; forming spacers on sidewalls of the gate stack; forming recesses in the silicon substrate along the gate spacers; epitaxially growing SiGe stressors in the recesses; and then annealing. SiGe stressors apply a compressive stress to the channel region, which is located between a source SiGe stressor and a drain SiGe stressor. Similarly, for NMOS devices, stressors that may introduce tensile stresses, such as SiC stressors, may be formed.

The application of stresses into channel regions of MOS device has significantly improved the performances of MOS devices. Accordingly, the formation of stressors has become a common practice. Due to the direct correlation between stress levels and the drive currents of MOS devices, new methods and structures are currently developed to further increase the stress levels. A new structure of MOS devices is provided by the present invention to respond to newly developed materials and techniques.

SUMMARY OF THE INVENTION

In accordance with one aspect of the present invention, a semiconductor structure includes a semiconductor substrate having a top surface; a gate stack on the semiconductor substrate; and a stressor in the semiconductor substrate and adjacent the gate stack. The stressor comprises at least a first portion with a first top surface lower than the top surface of the semiconductor substrate.

In accordance with another aspect of the present invention, a metal-oxide-semiconductor (MOS) device includes a semiconductor substrate; a gate stack on the semiconductor substrate, wherein the gate stack and the semiconductor substrate have an interface; a gate spacer on a sidewall of the gate stack; and a silicon germanium (SiGe) stressor in the semiconductor substrate. The SiGe stressor has a first top surface substantially lower than the interface, and the first top surface has an inner end substantially aligned with an outer sidewall of the gate spacer. The MOS device further includes a contact etch stop layer (CESL) over the SiGe stressor, the gate spacer and the gate stack, wherein the CESL has an inherent compressive stress.

In accordance with yet another aspect of the present invention, a method for forming a semiconductor structure includes providing a semiconductor substrate having a top surface; forming a gate stack on the semiconductor substrate; forming a recess in the semiconductor substrate adjacent the gate stack; and filling the recess with a material different from the semiconductor substrate to form a stressor, wherein the stressor comprises at least a first portion with a first top surface lower than the top surface of the semiconductor substrate.

In accordance with yet another aspect of the present invention, a method of forming a semiconductor structure includes providing a semiconductor substrate; forming a gate stack on the semiconductor substrate, wherein the gate stack and the semiconductor substrate have an interface; forming a first gate spacer on a sidewall of the gate stack; forming a recess in the semiconductor substrate, wherein the recess is substantially aligned with an outer edge of the first gate spacer; forming a SiGe stressor in the recess, wherein the SiGe stressor has a first top surface substantially lower than the interface; and forming a CESL over the SiGe stressor, the gate spacer and the gate stack, wherein the CESL has an inherent compressive stress.

The advantageous features of the present invention include improved stress in the channel region of the resulting MOS device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
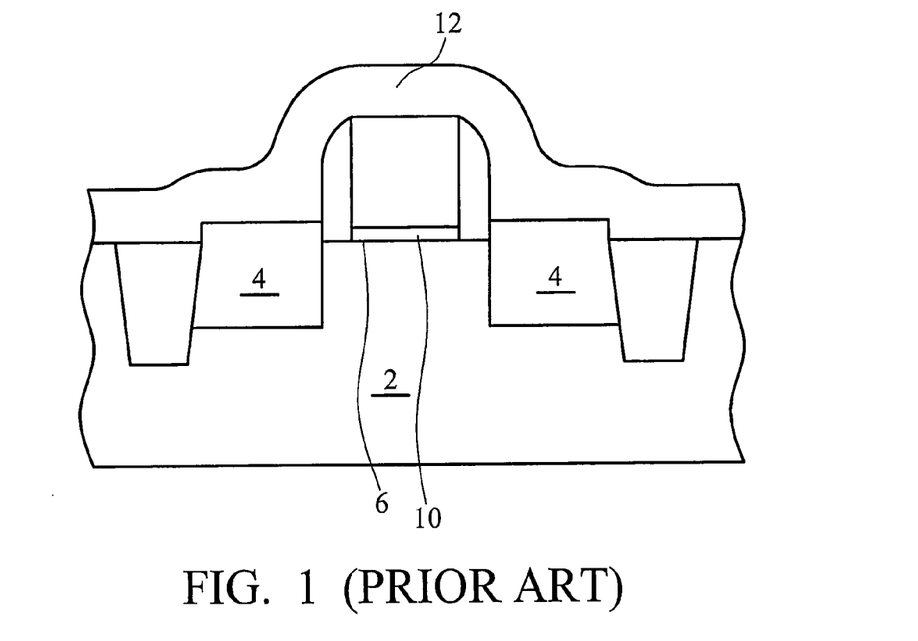
FIG. 1 illustrates a conventional PMOS device.

FIG. 1 illustrates a conventional p-type metal-oxide-semiconductor (PMOS) device, which includes silicon germanium (SiGe) stressors 4 formed in semiconductor substrate 2. Conventionally, to increase the stress applied to the channel region of the PMOS device, the top surfaces of SiGe stressors 4 are higher than top surface 6 of semiconductor substrate 2, which is also the interface between semiconductor substrate 2 and gate dielectric 10.

Stresses in the channel regions of MOS devices may be applied by various components, such as stressors formed in source and drain regions (hereinafter referred to as source/drain regions), and stressed contact etch stop layers (CESL). In older generations of MOS devices, CESLs had inherent tensile stresses, and hence applied detrimental stresses to the channel regions of PMOS devices. The raised SiGe stressors 4 hence prevent CESL 12 from being too close the respective channel region, and thus the likely detrimental tensile stress applied by CESL 12 is reduced. In addition, thicker SiGe stressors 4 may apply greater stresses to the channel region than thinner SiGe stressors.

Recently, CESLs are also used to apply desired stresses to the channel regions of MOS devices, wherein the stresses in the CESLs are developed either through the selection of appropriate materials, or through appropriate formation processes. Accordingly, other components of the MOS devices need to make corresponding changes in order to further improve the performance of MOS devices.

Figure 2:
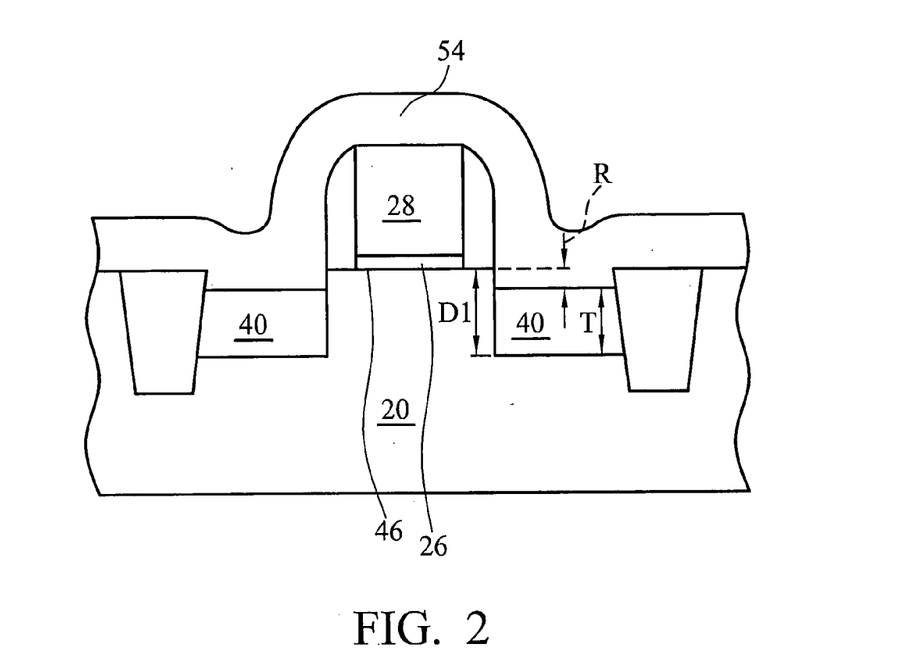
FIG. 2 illustrates an embodiment of the present invention.

The thickness of SiGe stressors has been studied by inventors to reveal the relationship between the thicknesses of SiGe stressors and stresses in channel regions. FIG. 2 illustrates a sample PMOS structure, which is also an embodiment of the present invention, on which simulations have been performed. The sample PMOS device includes semiconductor substrate 20, gate dielectric 26 and gate electrode 28. SiGe stressors 40 are formed in recesses in semiconductor substrate 20. The recesses have a depth D1 of about 700A. SiGe stressors 40 have a thickness T. CESL 54 is formed over SiGe stressors 40 and gate electrode 28, wherein CESL 54 has a thickness of about 800 Å, and an inherent compressive stress of about 2.8 GPa.

Figure 3:
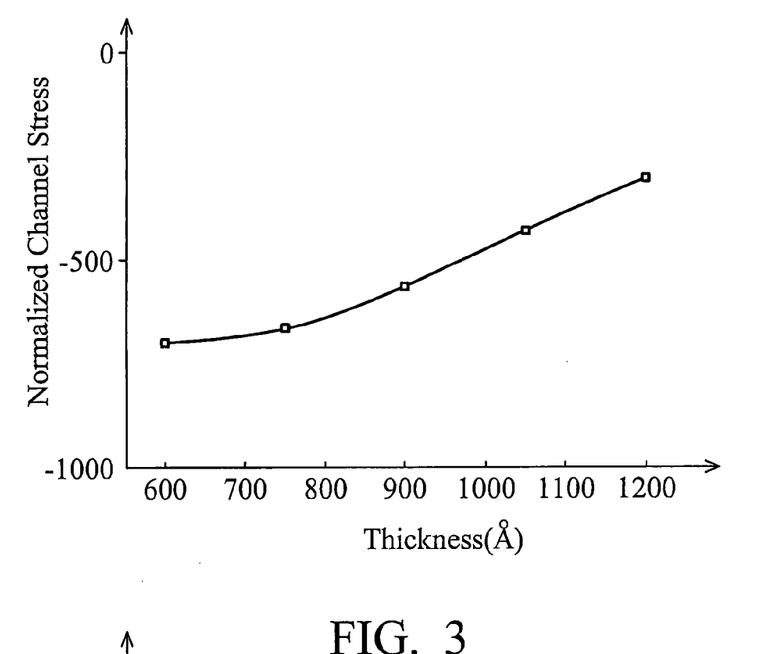
FIGS. 3 through 10 are cross-sectional views of intermediate stages in the manufacturing of a first embodiment of the present invention.

FIG. 3 illustrates the simulation results, wherein normalized channel stresses are shown as a function of thickness T of SiGe stressors 40. Since depth D1 of the recesses are about 700 Å, if thickness T is less than about 700 Å, SiGe stressors 40 are recessed below top surface 46 of substrate 20 (refer to FIG. 3). Conversely, if thickness T is greater than about 700 Å, SiGe stressors 40 are raised above top surface 46 of substrate 20, and hence the resulting PMOS structure is similar to what is shown in FIG. 1. It is noted when thickness T is equal to about 600 Å, which means the top surface of SiGe stressors 40 is recessed by a distance R (refer to FIG. 3) of about 100 Å below top surface 46, the compressive stress in the channel region has a great magnitude. When thickness T increases, the channel stresses steadily decrease. This reveals the channel regions of MOS devices having raised SiGe regions actually have lower stresses than the MOS devices with recessed SiGe regions.

The results shown in FIG. 3 may be related to the stresses applied by stressed CESLs. The channel stress includes a first portion applied by SiGe stressors 40 and a second portion applied by CESL 54. The first and the second portions have to be balanced in order to achieve optimum effects. Since CESL 54 has a high stress of about 2.8 GPa, if the SiGe stressors 40 are recessed, although the first portion of the channel stress is reduced, the second portion is increased, more than compensating for the loss of the first portion, thus the overall stress increases.

Figure 4:
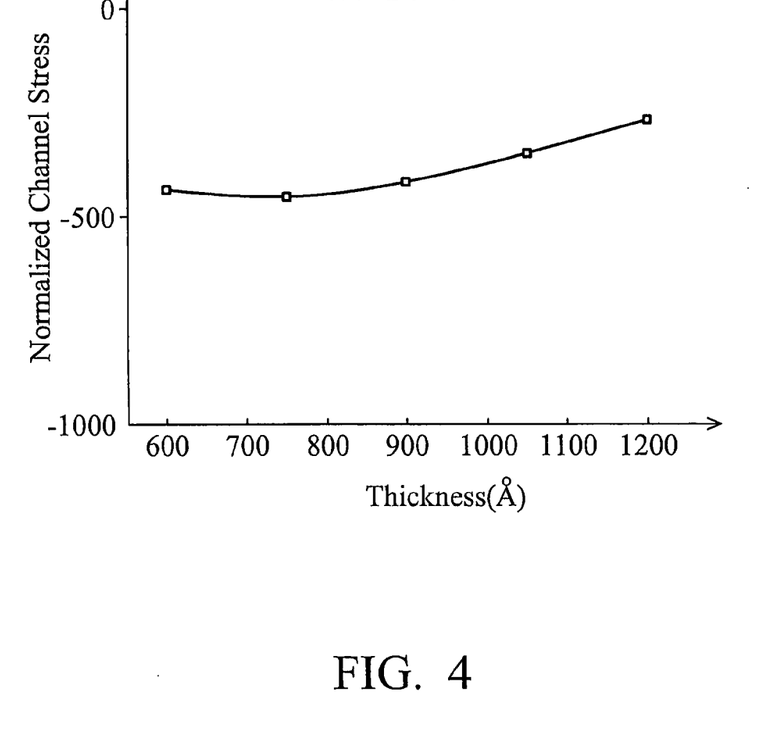

It is appreciated that the optimum recess distance R is related to various factors, such as the inherent stress of SiGe stressors 40, the inherent stress of CESL 54, and the thickness of CESL 54. FIG. 4 illustrates additional simulation results, wherein the simulated sample MOS devices are similar to the PMOS device shown in FIG. 3, except CESL 54 now has a thickness of 500 Å. As is known in the art, a thin CESL has a smaller ability for applying stress to the channel region than a thick CESL, even if the inherent stresses of the thick CESL and the thin CESL are the same. The simulation results indicate that the greatest channel stress occurs at a thickness T of about 700 Å to about 750 Å, which means the top surfaces of SiGe stressors 40 are substantially level with, or slightly higher than, top surface 46 of semiconductor substrate 20. This is possibly because with CESL 54 having a lesser ability to apply stress, if SiGe stressors 40 are recessed, the first portion of the channel stress is reduced, and the second portion is increased. However, the increase in the second portion cannot compensate for the decrease in the first portion. It may be construed that the optimal position of the top surface of SiGe stressors 40 has a correlation with the inherent stress and thickness of CESL 54, and a CESL with a greater inherent stress and/or a greater thickness demands a smaller thickness of SiGe regions, or in other words, recessed SiGe regions. Accordingly, to determine the optimum recess distance R, the inherent stress and the thickness of CESL 54 needs to be determined first.

Based on the above-findings, a novel method for improving the stress in the channel regions of MOS devices is provided. The intermediate stages of manufacturing embodiments of the present invention are illustrated in FIGS. 3 through 10. Variations of the preferred embodiments are then discussed. Throughout the various views and illustrative embodiments of the present invention, like reference numbers are used to designate like elements.

Figure 5:
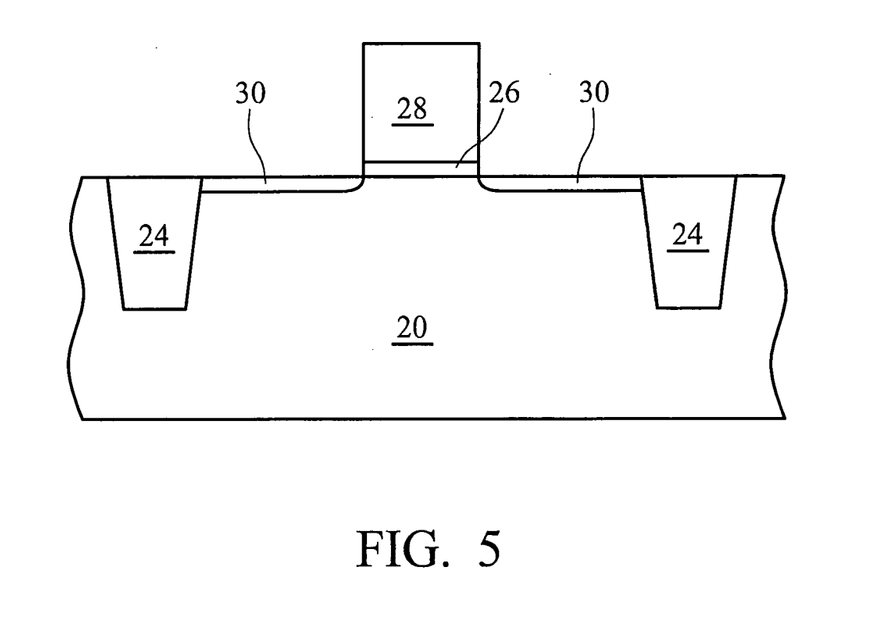

FIGS. 5 through 11 illustrate a first embodiment of the present invention. Referring to FIG. 5, substrate 20 is provided. Preferably, substrate 20 comprises bulk silicon. Alternatively, substrate 20 comprises compounds of group III, group IV and/or group V elements. Substrate 20 may also have a composite structure such as silicon-on-insulator (SOI) structure. Shallow trench isolation (STI) regions 24 are formed in substrate 20 to isolate device regions. As is known in the art, STI regions 24 may be formed by etching substrate 20 to form recesses, and then filling the recesses with dielectric materials such as high-density plasma oxide.

A gate stack comprising gate dielectric 26 and gate electrode 28 is formed on substrate 20. Gate dielectric 26 may include commonly used dielectric materials such as oxides, nitrides, oxynitrides, and combinations thereof. Gate electrode 28 may include doped polysilicon, metals, metal silicides, metal nitrides, and combinations thereof. As is known in the art, gate dielectric 26 and gate electrode 28 are preferably formed by depositing a gate electrode layer on a gate dielectric layer, and then patterning the gate electrode layer and the gate dielectric layer.

Lightly doped source/drain (LDD) regions 30 are then formed, preferably by implanting a p-type impurity, as is also shown in FIG. 5. Gate electrode 28 acts as a mask so that LDD regions 30 are substantially aligned with the edges of gate electrode 28. Halo and/or pocket regions (not shown) may also be formed, preferably by implanting n-type impurities.

Figure 6:
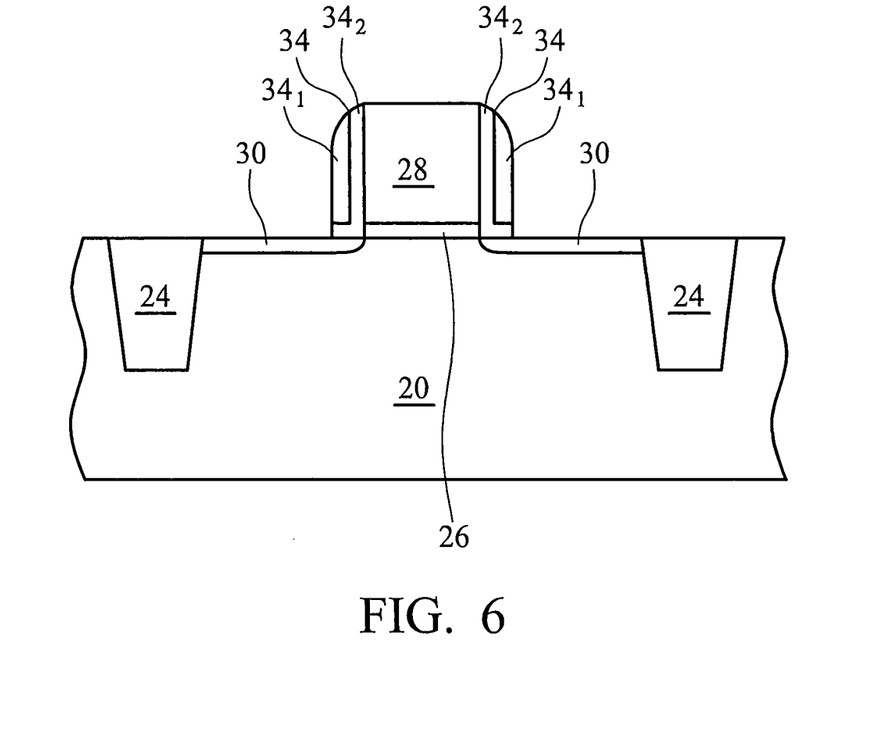

FIG. 6 illustrates the formation of gate spacers 34. As is known in the art, to form gate spacers 34, a gate spacer layer (not shown) is first formed. In an embodiment, the gate spacer layer includes a nitride layer on an oxide layer. In alternative embodiments, the gate spacer layer may include a single layer or more than two layers, each comprising oxide, silicon nitride, silicon oxynitride (SiON) and/or other dielectric materials. The gate spacer layer may be formed using commonly used techniques, such as plasma enhanced chemical vapor deposition (PECVD), low-pressure chemical vapor deposition (LPCVD), sub-atmospheric chemical vapor deposition (SACVD), and the like.

The gate spacer layer is then patterned to form gate spacers 34, wherein the patterning may be performed by either wet etching or dry etching. Horizontal portions of the gate spacer layer are removed, and the remaining portions form gate spacers 34. In the embodiment wherein the spacer layer includes the nitride layer on the oxide layer, gate spacers 34 each include an oxide liner $34_2$ and an overlying nitride layer $34_1$.

Figure 7:
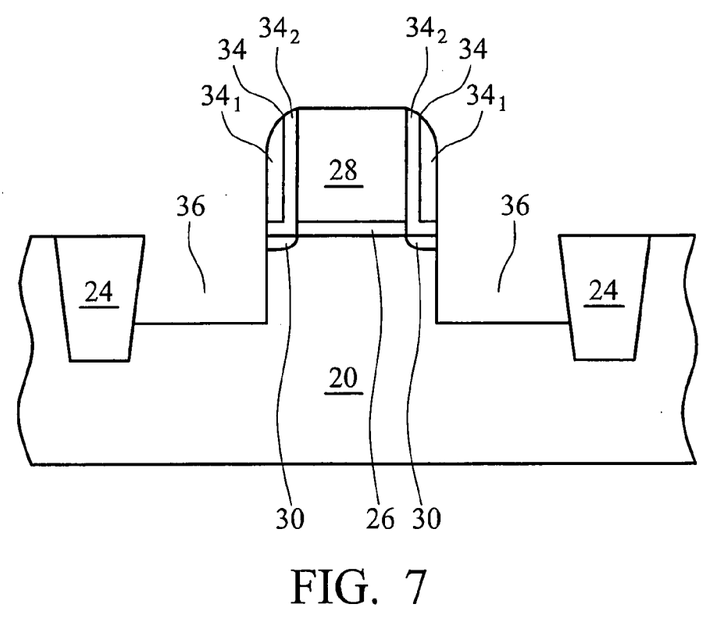

Referring to FIG. 7, recesses 36 are formed along the edges of gate spacers 34, preferably by etching isotropically or anisotropically. In 90 nm technology, the preferred depth of recesses 36 is between about 500 Å and about 1000 Å, and more preferably between about 700 Å and 900 Å. One skilled in the art will realize that the dimensions provided throughout the description are merely examples, and the preferred dimensions will change with the scaling of the technology used for forming the integrated circuits.

Figure 8:
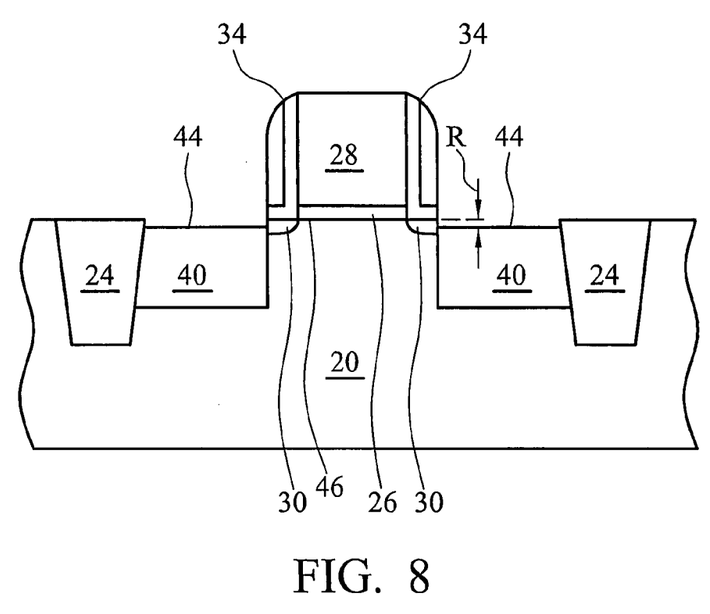

FIG. 8 illustrates the formation of epitaxy regions 40, which are equally referred to as SiGe stressors 40. Preferably, SiGe stressors 40 are epitaxially grown in recesses 36 by a selective epitaxial growth (SEG). In an exemplary embodiment, SiGe stressors 40 are formed in a chamber using PECVD. The precursors may include Si-containing gases and Ge-containing gases, such as $SiH_4$ and $GeH_4$, respectively.

In the preferred embodiment, SiGe stressors 40 have top surfaces 44 recessed below the interface 46 between semiconductor substrate 20 and gate dielectric 26, wherein interface 46 levels with the top surface of semiconductor substrate 20. P-type impurities, such as boron, may be doped as the epitaxial growth of SiGe stressors 40 proceeds. The recess distance R is preferably greater than about 50 Å, and more preferably greater than about 100 Å, and even more preferably between about 50 Å and 500 Å. It is to be realized that the optimum recess distance R is related to the stress applied by a subsequently formed CESL layer. A CESL with a greater inherent stress and/or a greater thickness may need a greater recess distance R. Conversely, if the CESL has a small inherent stress and/or a small thickness, the top surfaces 44 of SiGe stressor need to have a reduced recess distance R, or may even need to be raised, in order to have an optimum channel stress.

Figure 9:
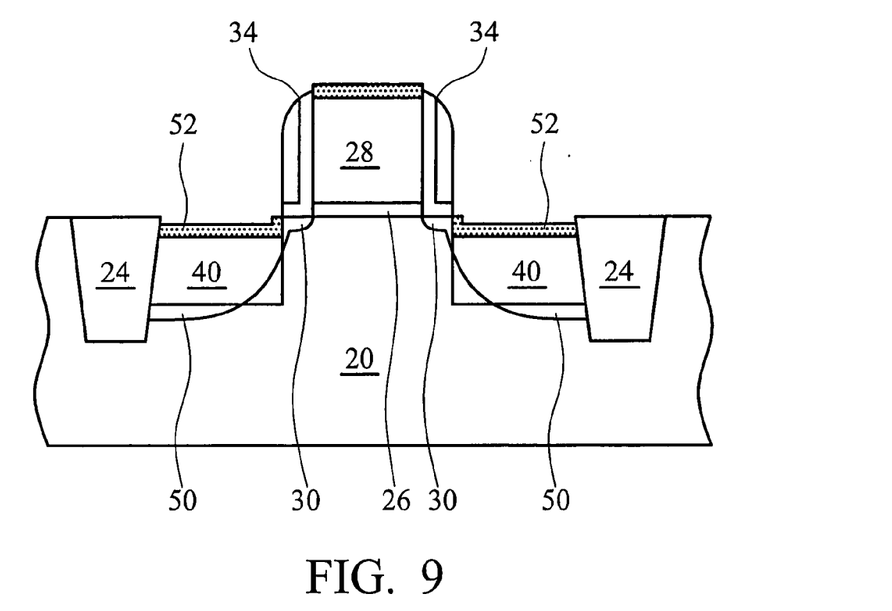

An impurity implantation may be performed to form deep source/drain regions 50, as is shown in FIG. 9. Preferably, deep source/drain regions 50 are formed by implanting p-type impurities.

FIG. 9 also illustrates the formation of germano-silicide regions 52. Throughout the description, germano-silicide regions 52 are also referred to as silicide regions 52. As is known in the art, silicide regions 52 are preferably formed by blanket depositing a thin layer of metal, such as nickel, platinum, cobalt, and combinations thereof. The substrate is then heated, causing the silicon and germanium to react with the metal where contacted. After the reaction, a layer of metal silicide and/or metal germano-silicide is formed between silicon/germanium and metal. The un-reacted metal is selectively removed through the use of an etchant that attacks metal but does not attack silicide and germano-silicide. In the resulting structure, depending on the value of the recess distance R, at least a portion, or substantially an entirety, of the top surface of germano-silicide regions 52 may be lower than top surface 46 of substrate 20, or in other words, lower than the interface between substrate 20 and gate dielectric 26.

Figure 10:
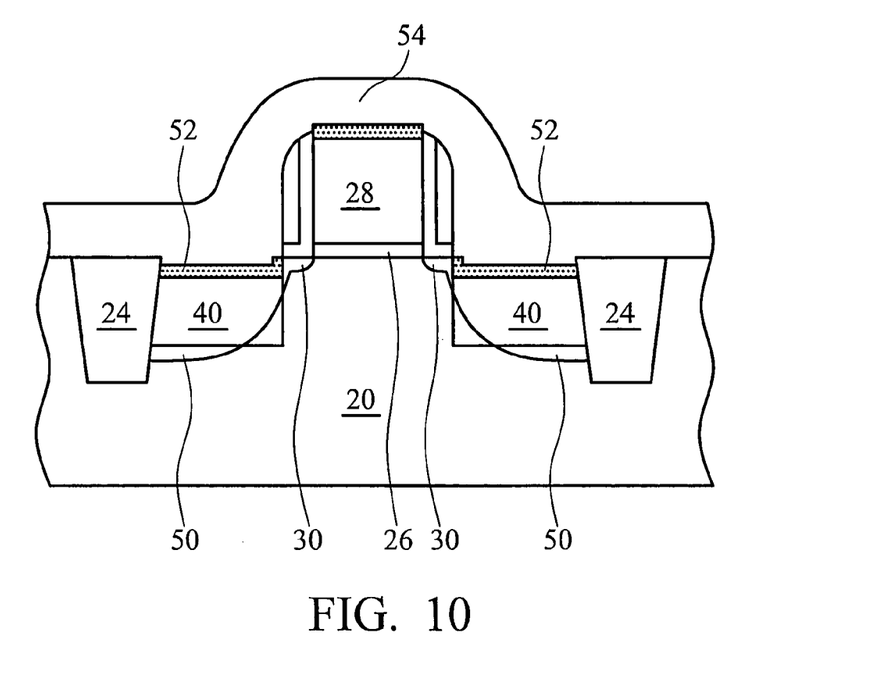

FIG. 10 illustrates the formation of CESL 54, which may include dielectric material such as silicon nitride, silicon carbide, silicon oxynitride, silicon oxycarbide, and combinations thereof. The formation process is adjusted to generate a high compressive stress in CESL 54. Preferably, the compressive stress is greater than about 1 GPa, and more preferably greater than about 2 GPa. The thickness of CESL 54 is preferably greater than about 100 Å, so that it has a great ability for applying a high stress to the channel region of the resulting MOS device.

Figure 11:
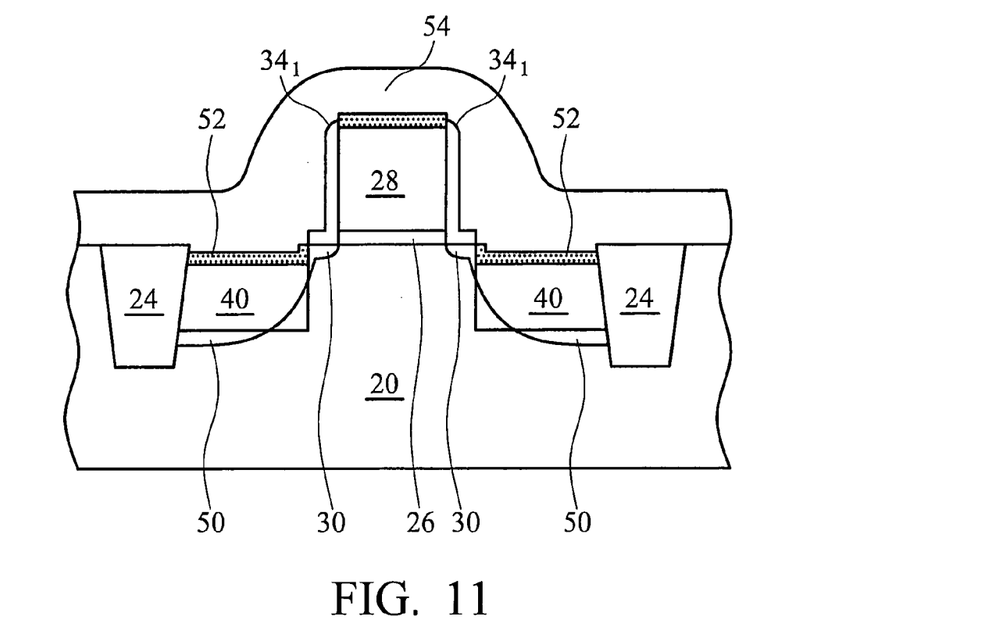
FIG. 11 is a cross-sectional view of a second embodiment of the present invention, wherein gate spacers each only include a spacer liner.

FIG. 11 illustrates a second embodiment of the present invention. This embodiment is similar to the first embodiment, except that after the process step shown in FIG. 8 or FIG. 9 is performed, spacer layers $34_2$ are removed. In the resulting PMOS device as shown in FIG. 11, CESL 54 is closer to the channel region than the PMOS device shown in FIG. 10. Accordingly, the compressive stress applied by CESL 54 is increased.

Figure 12:
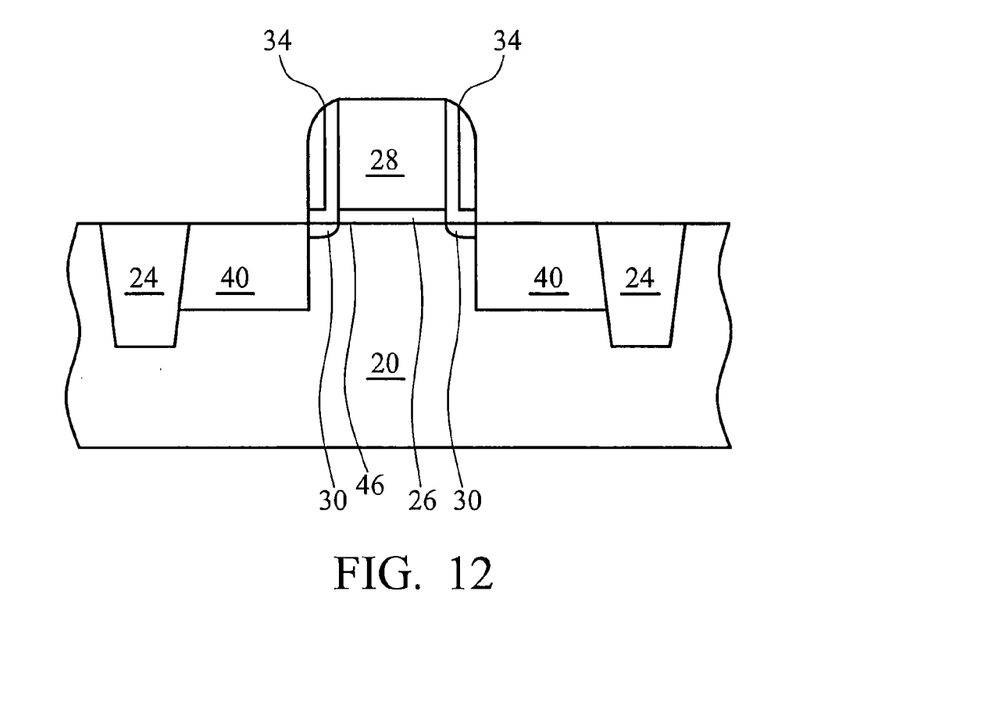
FIGS. 12 through 15 are cross-sectional views of intermediate stages in the manufacturing of a third embodiment of the present invention.
Figure 13:
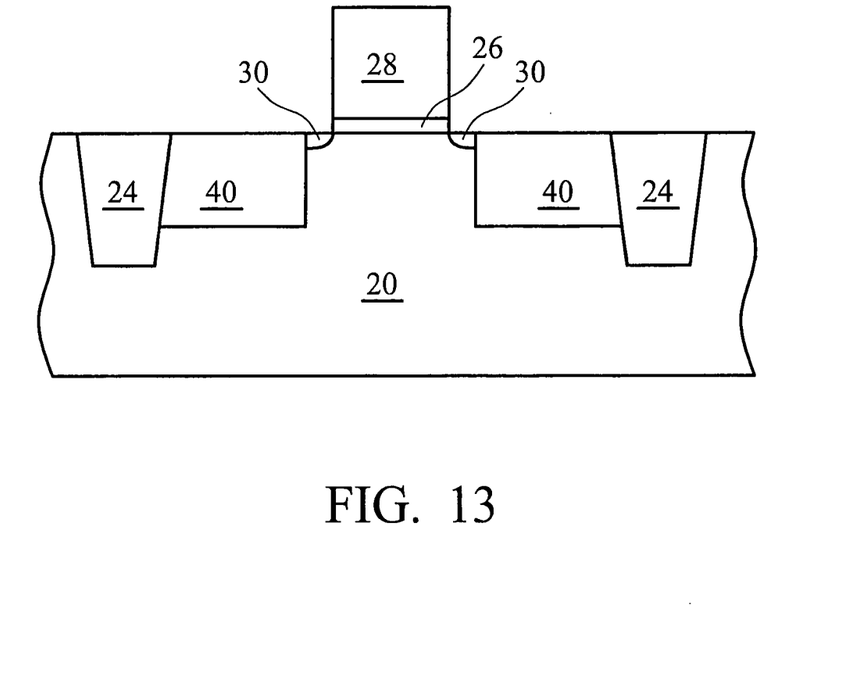

FIGS. 12 through 15 illustrate a third embodiment of the present invention. The initial process steps and structures are essentially the same as shown in FIGS. 5 through 7. Next, as shown in FIG. 12, SiGe stressors 40 are formed. Preferably, SiGe stressors 40 have top surfaces substantially level with interface 46. Alternatively, the top surfaces of SiGe stressors 40 may be slightly above or below interface 46. Gate spacers 34, which act as dummy spacers in this embodiment, are then removed. The resulting structure is shown in FIG. 13. Preferably, dummy spacers 34 are thin spacers, with a small thickness, for example, less than about 200 Å.

Figure 14:
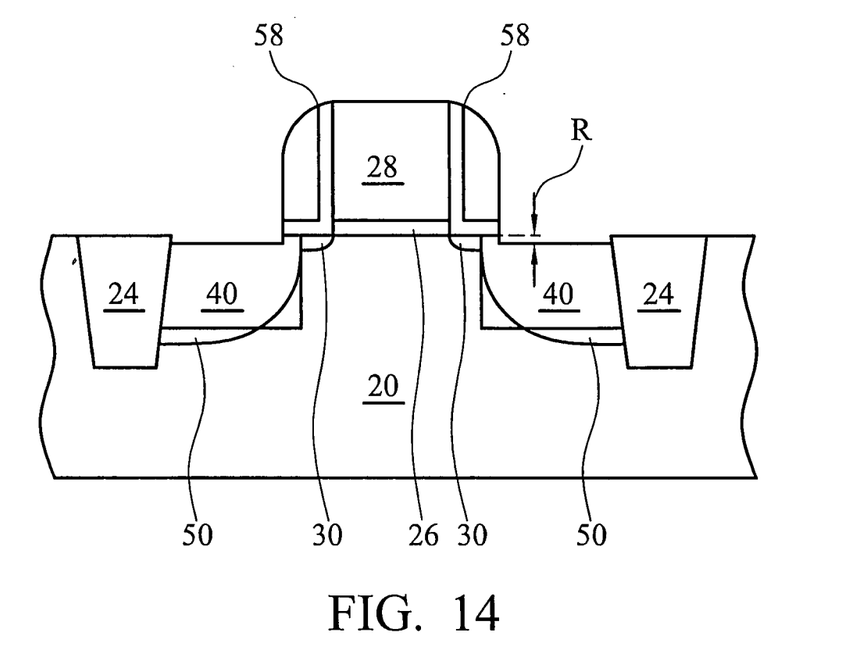
Figure 15:
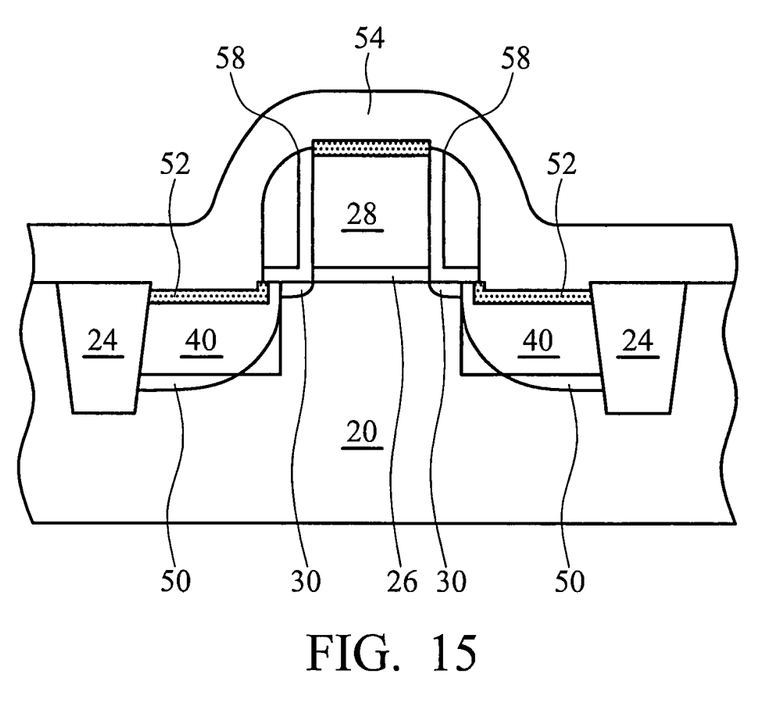

Referring to FIG. 14, gate spacers 58 are formed. Preferably, gate spacers 58 have a greater thickness than the removed dummy spacers 34 (refer to FIG. 12). The difference between the thicknesses of dummy spacers 34 and gate spacers 58 is preferably between about 20 Å and about 50 Å, although the difference in thicknesses may change with the scaling of the formation technology. As a result, gate spacers 58 cover portions of SiGe stressors 40. In subsequent steps, exposed portions of SiGe stressors 40 are recessed, wherein the recess distance R is essentially the same as in FIG. 9. Next, deep source/drain regions 50 are formed, followed by the formation of silicide regions 52 and CESL 54, as illustrated in FIG. 15. Similar to the first and the second embodiments, CESL 54 preferably has a high compressive stress.

Although the embodiments discussed in the preceding paragraphs uses SiGe stressors in PMOS devices as examples, one skilled in the art will realize that the concept of the present invention is readily available for the formation of NMOS devices. The NMOS devices may have a similar structure as illustrated in FIGS. 10, 11 and 15, except that stressors 40 comprise a semiconductor material having a smaller lattice constant than semiconductor substrate 20, such as SiC. Accordingly, n-type impurities such as phosphorus and/or arsenic are implanted to form LDD regions 30 and deep source/drain regions 50. Accordingly, the respective CESL 54 preferably has a high tensile stress.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A metal-oxide-semiconductor (MOS) device comprising:
   a semiconductor substrate having a top surface;
   a gate stack on the semiconductor substrate; and
   stressors in the semiconductor substrate on opposing sides of the gate stack, wherein each stressor comprises at least a first portion with a first top surface lower than the top surface of the semiconductor substrate and a second portion having a second top surface higher than the first top surface, and wherein the second portion is directly under a gate spacer on a sidewall of the gate stack, wherein the semiconductor substrate directly under the gate stack is the same material as directly under the stressors, the first portion extending from the second portion to an isolation region, the first top surface of the first portion being planar, an upper surface of the first portion of the stressors being self-aligned with the gate spacer and silicided, an upper surface of the silicide being lower than the top surface of the semiconductor substrate.

2. The MOS device of claim 1, wherein the first top surface is lower than the top surface of the semiconductor substrate by greater than about 50 Å.

3. The MOS device of claim 1, being a p-type MOS device, wherein the stressors comprise silicon germanium.

4. The MOS device of claim 1, being an n-type MOS device, wherein the stressors comprise silicon carbide.

5. The MOS device of claim 1, wherein the stressors have a substantially flat top surface.

6. The MOS device of claim 1, wherein the first top surface is lower than the second top surface by greater than about 50 Å.

7. The MOS device of claim 1, further comprising a contact etch stop layer over the stressors and the gate stack, wherein the contact etch stop layer has an inherent stress with a magnitude of greater than about 1 GPa.

8. The MOS device of claim 7, wherein the contact etch stop layer has a thickness of greater than about 100 Å.

9. The MOS device of claim 1 further comprising:
   a spacer liner on the sidewall of the gate stack, wherein the spacer liner comprises a portion extending on the semiconductor substrate; and
   a contact etch stop layer directly on and contacting the spacer liner.

10. A metal-oxide-semiconductor (MOS) device comprising:
    a semiconductor substrate;
    a gate stack on the semiconductor substrate, wherein the gate stack and the semiconductor substrate have an interface;
    a gate spacer on a sidewall of the gate stack;
    a silicon germanium (SiGe) stressor in the semiconductor substrate, wherein the SiGe stressor has a first top surface silicided and substantially lower than the interface and having no recess, and wherein the first top surface has an inner end self-aligned with an outer sidewall of the gate spacer, the SiGe stressor further comprising an additional portion directly underlying the gate spacer, the semiconductor substrate directly adjacent vertical sidewalls of the SiGe stressor being uniform, the SiGe stressor extending to an isolation region, wherein the silicide region of the first top surface comprises a top surface having at least a substantial portion lower than a top surface of the semiconductor substrate; and
    a contact etch stop layer (CESL) over the SiGe stressor, the gate spacer, and the gate stack, wherein the CESL has an inherent compressive stress.

11. The MOS device of claim 10, wherein the inherent compressive stress of the CESL is greater than about 1 GPa.

12. The MOS device of claim 10, wherein the CESL has a thickness of greater than about 100 Å.

13. The MOS device of claim 10, wherein the first top surface of the SiGe stressor is lower than the interface by greater than about 50 Å.

14. The MOS device of claim 10, wherein the gate spacer comprises only a spacer liner, and wherein the spacer liner has an L-shape.

15. The MOS device of claim 10, wherein the additional portion has a second top surface higher than the first top surface.

16. The MOS device of claim 15, wherein the second top surface of the SiGe stressor is substantially level with the interface.

17. The MOS device of claim 15, wherein the second top surface is in contact with the gate spacer.

18. The MOS device of claim 10, wherein the silicide region comprises a top surface having at least a substantial portion lower than the interface between the semiconductor substrate and the gate stack.

* * * * *